US009255029B2

(12) United States Patent
Veerasamy (10) Patent No.: US 9,255,029 B2
(45) Date of Patent: Feb. 9, 2016

(54) METHOD OF MAKING HEAT TREATED COATED ARTICLE USING TCO AND REMOVABLE PROTECTIVE FILM

(75) Inventor: Vijayen S. Veerasamy, Ann Arbor, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 0 days.

(21) Appl. No.: 13/448,733

(22) Filed: Apr. 17, 2012

(65) Prior Publication Data
US 2013/0273377 A1 Oct. 17, 2013

(51) Int. Cl.
| | |
|---|---|
| *B05D 5/12* | (2006.01) |
| *C03C 17/245* | (2006.01) |
| *H01L 31/02* | (2006.01) |
| *B05D 3/06* | (2006.01) |
| *H01L 31/0216* | (2014.01) |
| *C03C 17/34* | (2006.01) |
| *B32B 17/06* | (2006.01) |
| *B05D 3/02* | (2006.01) |
| *B32B 9/00* | (2006.01) |
| *B05D 7/00* | (2006.01) |
| *H01L 31/0224* | (2006.01) |

(52) U.S. Cl.
CPC ............ *C03C 17/2453* (2013.01); *B05D 3/068* (2013.01); *C03C 17/3423* (2013.01); *C03C 17/3429* (2013.01); *C03C 17/3435* (2013.01); *C03C 17/3441* (2013.01); *H01L 31/0216* (2013.01); *H01L 31/02021* (2013.01); *B05D 3/0254* (2013.01); *B05D 5/12* (2013.01); *B05D 7/56* (2013.01); *B32B 9/00* (2013.01); *B32B 17/06* (2013.01); *C03C 2217/231* (2013.01); *C03C 2217/948* (2013.01); *C03C 2218/355* (2013.01); *C03C 2218/365* (2013.01); *H01L 31/0224* (2013.01)

(58) Field of Classification Search
USPC .................. 427/108, 126.2, 154, 162, 165
See application file for complete search history.

(56) References Cited

U.S. PATENT DOCUMENTS

| | | | | |
|---|---|---|---|---|
| 4,439,463 A | * | 3/1984 | Miller ........................... | 427/563 |
| 5,180,690 A | * | 1/1993 | Czubatyj et al. .............. | 438/485 |
| 5,387,433 A | * | 2/1995 | Balian et al. ................ | 427/126.3 |

(Continued)

FOREIGN PATENT DOCUMENTS

| | | |
|---|---|---|
| DE | 37 18 789 A1 | 12/1987 |
| DE | WO 2012/022874 | 2/2012 |
| WO | WO 2010/139908 | 12/2010 |

OTHER PUBLICATIONS

U.S. Appl. No. 13/373,046, filed Nov. 3, 2011; Petrmichl et al.

(Continued)

*Primary Examiner* — Brian K Talbot
(74) *Attorney, Agent, or Firm* — Nixon & Vanderhye P.C.

(57) ABSTRACT

A method for making a heat treated (HT) coated article including an electrode, to be used in applications such as windows, electronic devices, or other applications. The method may include heat treating a substrate coated with at least a transparent conductive oxide (TCO) layer and an overlying film. From the TCO outwardly, the overlying film may include any combination of two, three or four of: (i) a gettering and/or doping layer(s); (ii) a stabilizing layer(s); (iii) a release layer(s); and (iv) an oxygen blocking or barrier layer. After HT, the protective film may be entirely or partially removed. Other embodiments relate to the pre-HT coated article, or the post-HT coated article.

26 Claims, 6 Drawing Sheets

(56) References Cited

U.S. PATENT DOCUMENTS

| | | | |
|---|---|---|---|
| 5,470,661 A | 11/1995 | Bailey et al. | |
| 5,635,245 A * | 6/1997 | Kimock et al. | 427/249.7 |
| 5,756,192 A * | 5/1998 | Crawley et al. | 428/216 |
| 5,858,477 A | 1/1999 | Veerasamy et al. | |
| 6,284,377 B1 | 9/2001 | Veerasamy | |
| 6,531,182 B2 | 3/2003 | Veerasamy et al. | |
| 6,592,992 B2 | 7/2003 | Veerasamy | |
| 6,592,993 B2 | 7/2003 | Veerasamy | |
| 8,071,166 B2 | 12/2011 | Petrmichl et al. | |
| 2003/0118860 A1 | 6/2003 | O'Shaughnessy et al. | |
| 2004/0209126 A1* | 10/2004 | Ziegler et al. | 428/702 |
| 2004/0258890 A1* | 12/2004 | Miller et al. | 428/195.1 |
| 2005/0095431 A1 | 5/2005 | Veerasamy | |
| 2005/0260419 A1 | 11/2005 | Hukari et al. | |
| 2007/0029186 A1* | 2/2007 | Krasnov et al. | 204/192.29 |
| 2008/0178632 A1 | 7/2008 | Petrmichl et al. | |
| 2008/0182033 A1* | 7/2008 | Krasnov et al. | 427/523 |
| 2008/0199702 A1 | 8/2008 | Murphy et al. | |
| 2008/0310005 A1* | 12/2008 | Tonar et al. | 359/265 |
| 2012/0040160 A1 | 2/2012 | Wang et al. | |
| 2012/0107554 A1* | 5/2012 | Pfaff et al. | 428/141 |

OTHER PUBLICATIONS

U.S. Appl. No. 13/369,337, filed Feb. 9, 2012; Petrmichl et al.
International Search Report mailed Jul. 15, 2013.

* cited by examiner

METHOD OF MAKING HEAT TREATED COATED ARTICLE USING TCO AND REMOVABLE PROTECTIVE FILM

Certain embodiments of this invention relate to a method of making a heat treated (HT) coated article including an electrode, to be used in applications such as electrochromic (EC) windows, insulating glass (IG) window units, photovoltaic applications, touch panels, electronic devices, or any other suitable application. For example, certain embodiments of this invention relate to a method of making a coated article including a step of heat treating a substrate (e.g., glass substrate such as soda-lime-silica based glass substrate, high temperature glass substrate, sapphire substrate, or silicon substrate) coated with at least a transparent conductive oxide (TCO) layer of or including a material such as indium tin oxide (ITO) and an overlying protective film thereon. In certain example embodiments, from the TCO outwardly, the protective film may be of or include any combination of two, three or four of the following: (i) a gettering and/or doping layer(s); (ii) a stabilizing layer(s); (iii) a release layer(s); and (iv) an oxygen blocking or barrier layer. Following and/or during heat treatment (e.g., thermal tempering or the like) the protective film may be entirely or partially removed. Other embodiments of this invention relate to the pre-HT coated article, or the post-HT coated article.

BACKGROUND OF THE INVENTION

Transparent conductive oxide (TCO) films of materials such as ITO, tin oxide, cadmium oxide, and the like are known in the art. Although there are many materials that are either (a) electrically conductive or (b) optically substantially transparent in the visible, TCOs exhibit a useful compromise of both these desirable properties. The metric that encodes this combination of properties is the ratio of $\sigma_{dc}/\sigma_{opt}$. According to electromagnetic theory, high conductivity and optical transparency are mutually exclusive properties. This is due to the fact that when there is a large density of charge carriers available to give rise to high electrical conduction; the incoming electromagnetic radiation is dissipated due to skin effect of the free charge carriers or simply reflected if the frequency of excitation is too high for the carriers to follow.

In semi-conducting oxide films such as tin oxide and indium oxide, good transparency and electrical conductivity can be obtained by adding dopants that enter substitutionally into the lattice or by adjusting the preparation condition, thereby obtaining a controlled non-stoichiometry of the material. Since the doping is done on an insulator whose band gap is greater than 3 eV, the material transmits most part of the visible radiation. Doping leads to two categories of transparent conducting oxides (TCOs), namely p-type and n-type. Binary compounds such as tin oxide, indium oxide and zinc oxide are n-type dopable transparent conducting oxides. $CuAlO_2$, $CuGaO_2$ and $SrCu_2O$ are p-type TCO compounds. The fact that these high performance TCOs rely on (i) binary, ternary or quarternary alloys and (ii) on controlled doping make their high temperature processing in ambient conditions very difficult. It is known in the art that a permanent thin dielectric barrier over the TCO can improve thermal processability to about 350-400 C, but this solution makes electrical contact to the film non-viable for most applications.

Commonly used as TCO electrodes in many opto-electronics applications, $In_2O_3$ and $In_2O_3:SnO_2$ (a form of ITO) are known wide band-gap oxide semiconductors (3.79 eV in bulk form). At low concentration of extrinsic dopant (e.g., SnO or Sn dopes indium oxide; or F does tin oxide), charge carriers are mainly attributed to oxygen vacancy defects, such as: $O_o \rightarrow \frac{1}{2}O_2+V^{2+}+2e$. Tin doping of $In_2O_3$ films to form ITO, for example, has been used to dramatically improve electrical conductivity where the substitution of two tin atoms and one oxygen interstitial form a charge neutral carrier site in addition to the intrinsic oxygen vacancy sites. A TCO in this respect is a degenerated semiconductor due to the dopant(s). Since grain boundaries act as impurity sinks, they are very relevant to electrical conduction. Therefore, changes in the grain boundary area per unit volume due to heat treatment will result in charge carrier concentration changes and eventually lead to large drifts in conductivity of the films. In addition, oxygen diffusion from the ambient atmosphere into the TCO film, as well as extrinsic dopants leaving the TCO film during HT, have the effect of adversely changing $\sigma_{dc}/\sigma_{opt}$.

However there are a range of applications whereby for various reasons the transparent substrates have to be heat-strengthened (e.g., glass to be thermally tempered) after TCO deposition thereon. Glass is often heat treated (HT), such as being thermally tempered, for safety and/or strengthening purposes. For example, glass substrates are often heat treated at a high temperature(s) (e.g., at least about 580 degrees C., more typically from about 600-650 degrees C.) for purposes of thermal tempering.

Accordingly, those skilled in the art will appreciate that a need in the art exists for a method of providing a heat treated (HT) coated article including an electrode where following HT the electrode still possesses sufficient electrical conductivity. A need for corresponding coated articles, both heat treated and pre-HT, also exists.

BRIEF SUMMARY OF EXAMPLES OF INVENTION

Certain example embodiments of this invention relate to a method of making a heat treated (HT) coated article including an electrode, to be used in applications such as electrochromic (EC) windows, insulating glass (IG) window units, photovoltaic applications, electronic devices, and/or any other suitable application. For example, certain embodiments of this invention relate to a method of making a coated article including a step of heat treating a substrate (e.g., soda-lime-silica based glass substrate, high temperature glass substrate, sapphire substrate, or silicon substrate) coated with at least a transparent conductive oxide (TCO) layer of or including a material such as indium tin oxide (ITO) or the like and an overlying protective film thereon. In certain example embodiments, from the TCO outwardly, the protective film may be of or include any combination of two, three or four of the following: (i) a gettering and/or doping layer(s); (ii) a stabilizing layer(s); (iii) a release layer(s); and (iv) an oxygen blocking or barrier layer. At least layers (iii) and (iv) are provided in the protective film in certain example preferred embodiments. Following and/or during heat treatment (e.g., thermal tempering or the like) the protective film may be entirely or partially removed. A "layer" herein may be continuous or discontinuous in different example embodiments. Other embodiments of this invention relate to the pre-HT coated article, or the post-HT coated article.

In certain example embodiments of this invention, there is provided a method of making a heat treated coated article, the method comprising: heat treating a coated substrate comprising a substrate, a transparent conductive oxide (TCO) layer on the substrate, and a protective film on the substrate over at least the TCO layer, wherein the protective film includes a release layer and an oxygen barrier layer where the release layer and the oxygen barrier layer are of different material and/or different stoichiometry relative to each other, wherein the heat treating comprises heating at least the substrate to temperature(s) of at least 500 degrees C.; during said heat treating of the coated substrate with the TCO layer and the protective film thereon, the protective film protects the TCO layer so that the TCO layer does not lose a significant amount of electrical conductivity and/or a significant amount of visible transmission during said heat treating; and exposing the protective film to a release liquid and removing at least part of the protective film during and/or after said heat treating.

In certain example embodiments of this invention, there is provided a method of making a heat treated coated article, the method comprising: heat treating a coated glass substrate comprising a glass substrate, a transparent conductive layer comprising ITO on the glass substrate, and a protective film on the glass substrate over at least the layer comprising ITO, wherein the protective film includes a release layer comprising zinc oxide and an oxygen barrier layer comprising metal nitride, wherein the heat treating comprises heating at least the glass substrate to temperature(s) of at least 500 degrees C.; during said heat treating of the coated glass substrate with the layer comprising ITO and the protective film thereon, the protective film protects the layer comprising ITO so that the layer comprising ITO does not lose a significant amount of electrical conductivity and/or a significant amount of visible transmission during said heat treating; and removing at least part of the protective film during and/or after said heat treating.

In certain example embodiments of this invention, there is provided a heat treated coated article comprising: a thermally tempered glass substrate; a transparent conductive layer comprising ITO on the tempered glass substrate; and wherein at least an upper portion of the layer comprising ITO is doped with carbon and/or fluorine.

DETAILED DESCRIPTION OF EXAMPLE EMBODIMENTS OF THE INVENTION

Referring now more particularly to the accompanying drawings in which like reference numerals indicate like parts throughout the several views.

Thus, the phrase "on the substrate" as used herein is not limited to being in direct contact with the substrate as other layer(s) may still be provided therebetween. Likewise, the word "on" as used herein covers both directly and indirectly on. For example, a layer is "on" another layer or a substrate even though other layer(s) may be provided therebetween.

Certain example embodiments of this invention relate to methods of making coated articles that may use heat treatment (HT), wherein the coated article includes a coating (one or more layers) of or including a transparent conductive oxide (TCO). In certain instances, the HT may involve heating a supporting substrate, with the TCO thereon, to temperature(s) of at least about 500 degrees C., more preferably at least about 550 degrees C., more preferably from about 550 to 800 degrees C., more preferably from 580 to 800 degrees C. In particular, certain example embodiments of this invention relate to a technique for allowing the TCO to withstand such HT without degrading with respect to electrical conductivity and/or visible transmission during the same. In certain embodiments, a sacrificial protective film is formed on the glass substrate over the TCO so as to protect the TCO during HT, Following HT, the sacrificial protective film (which may include one or more layers) may or may not be removed in different embodiments of this invention.

Certain example embodiments of this invention relate to a method of making a heat treated (HT) coated article including an electrode, to be used in applications such as electrochromic (EC) windows, insulating glass (IG) window units, photovoltaic applications, touch panels, OLED, electronic devices, and/or any other suitable application.

Figure 1A:
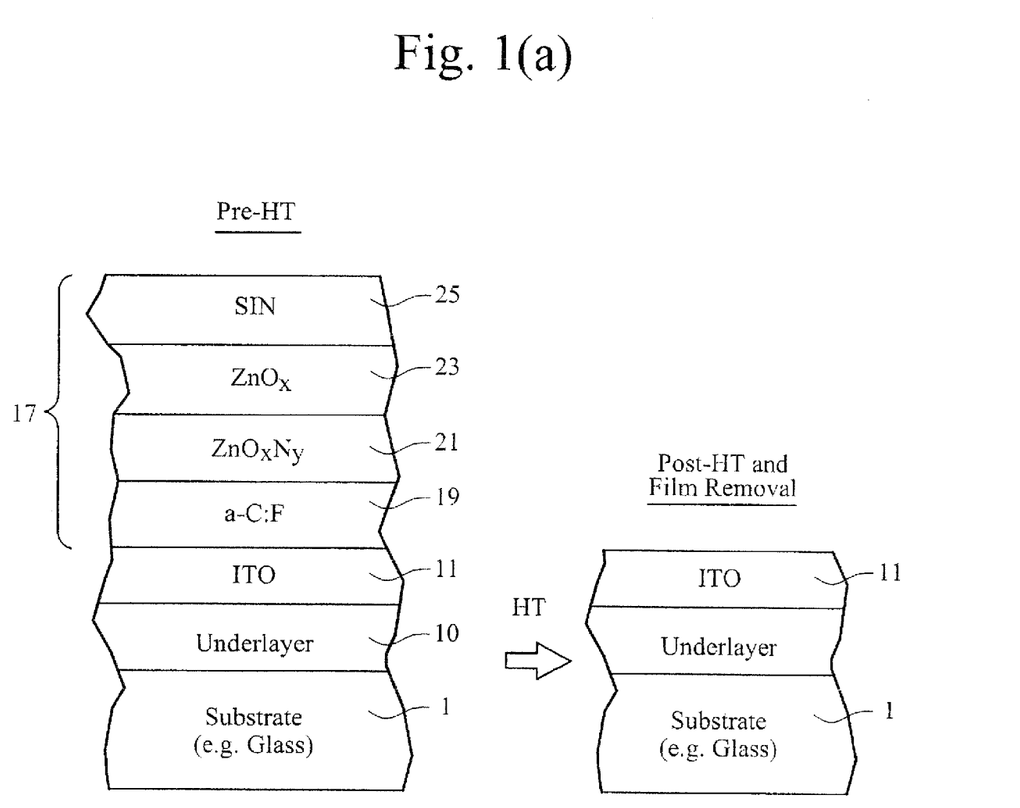
FIG. 1(a) is a schematic cross sectional view of a coated article, prior to and following heat treatment, according to an example embodiment of this invention.
Figure 1B:
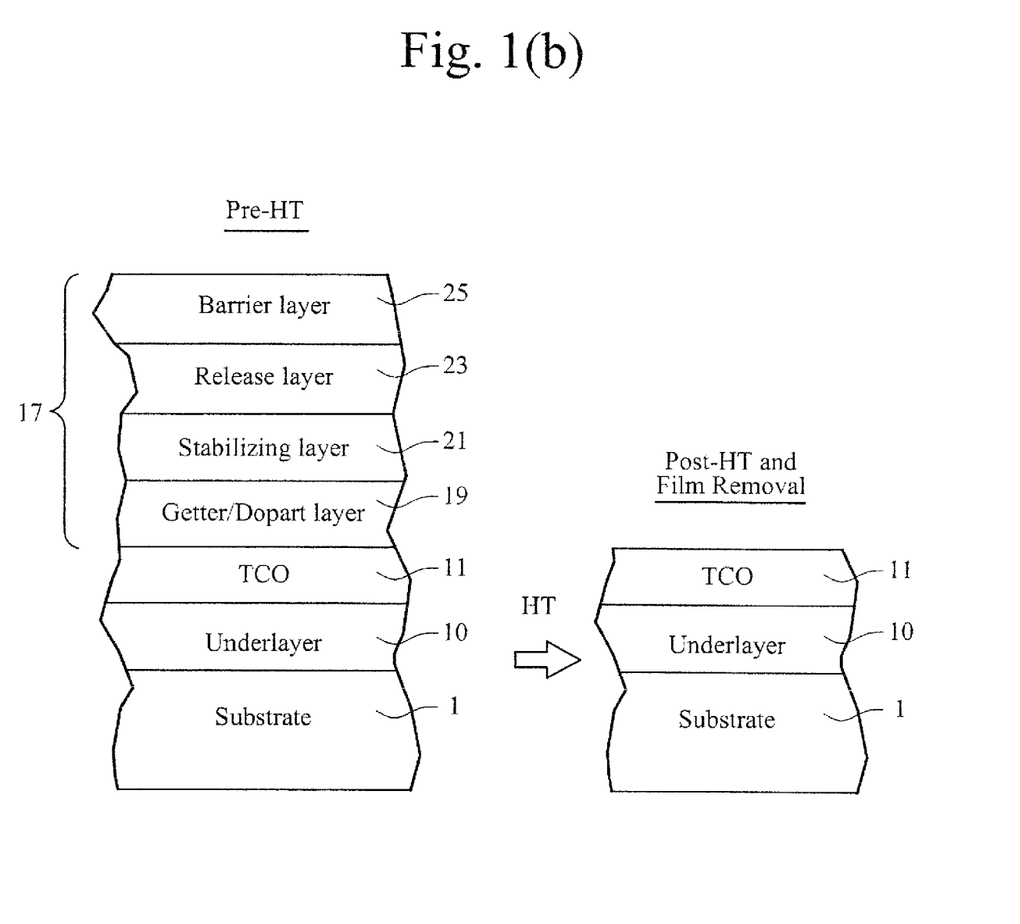
FIG. 1(b) is a schematic cross sectional view of a coated article, prior to and following heat treatment, according to an example embodiment of this invention.
Figure 2:
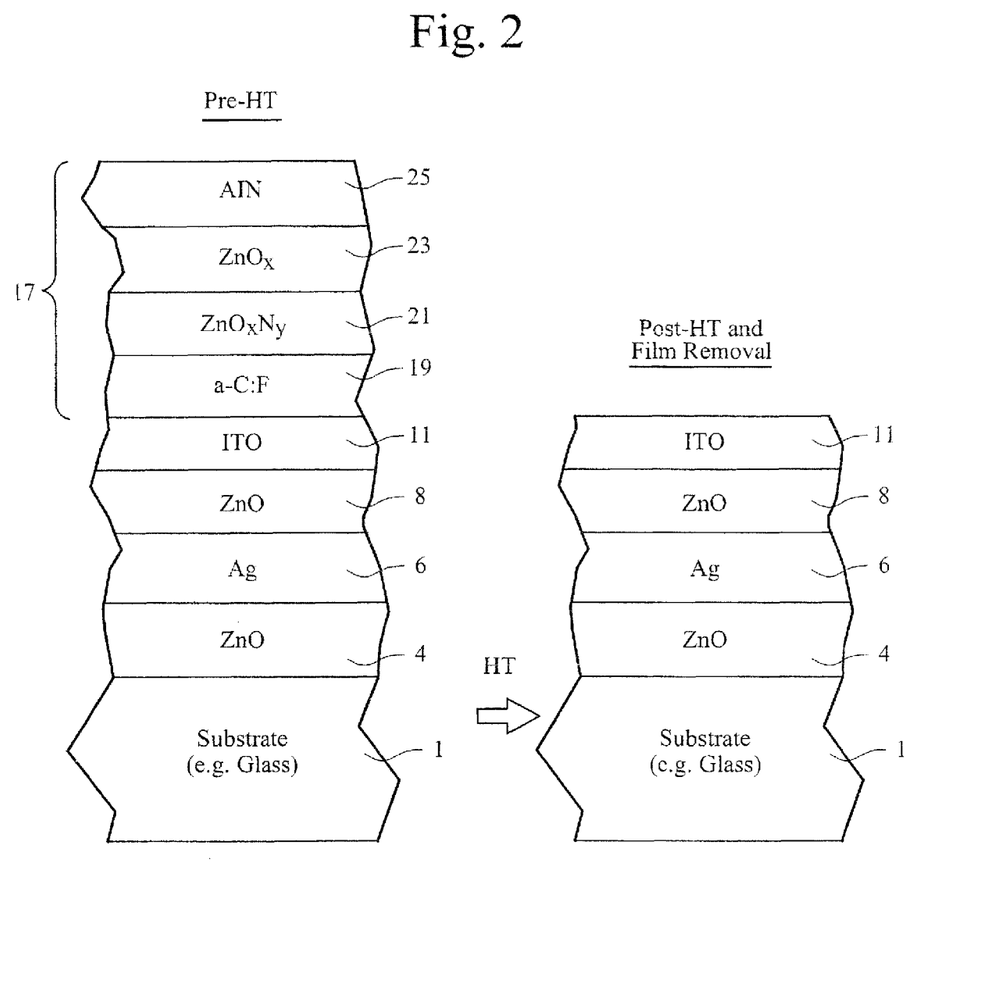
FIG. 2 is a schematic cross sectional view of a coated article, prior to and following heat treatment, according to another example embodiment of this invention.
Figure 3:
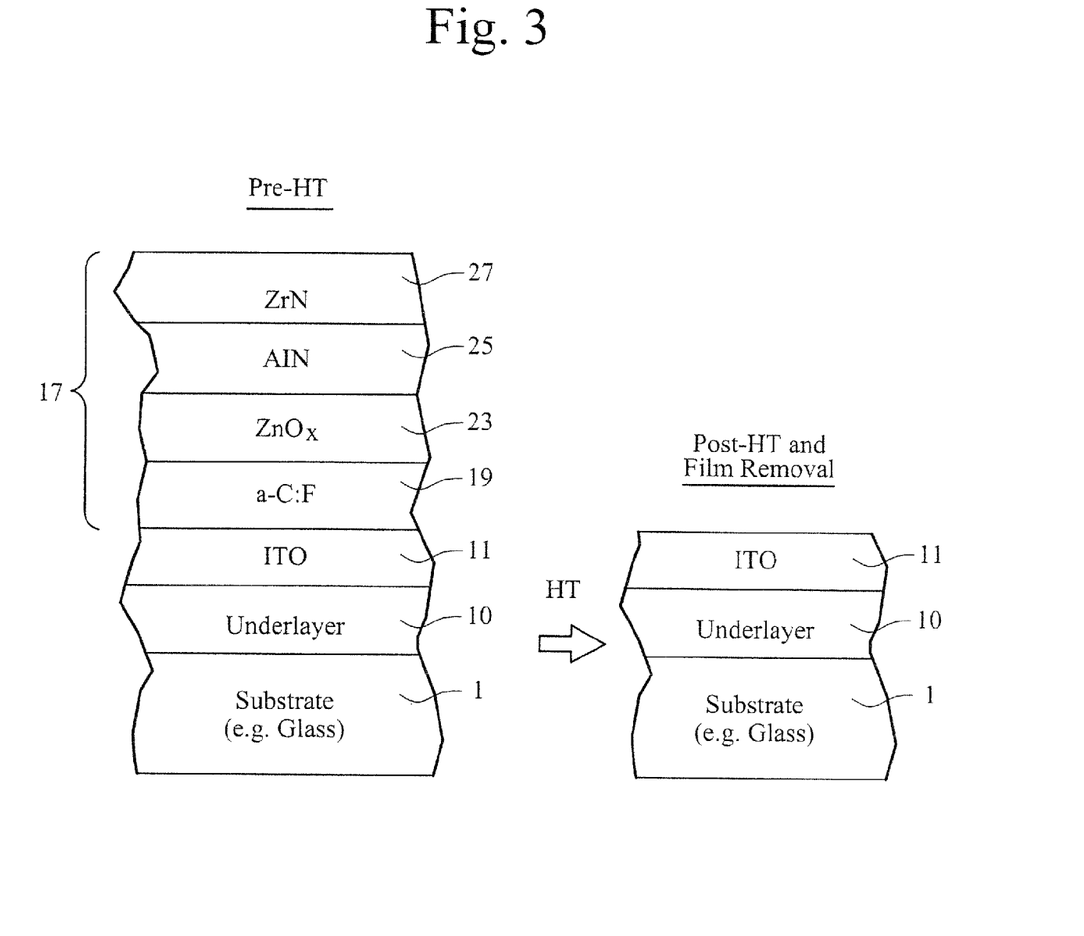
FIG. 3 is a schematic cross sectional view of a coated article, prior to and following heat treatment, according to another example embodiment of this invention.
Figure 4:
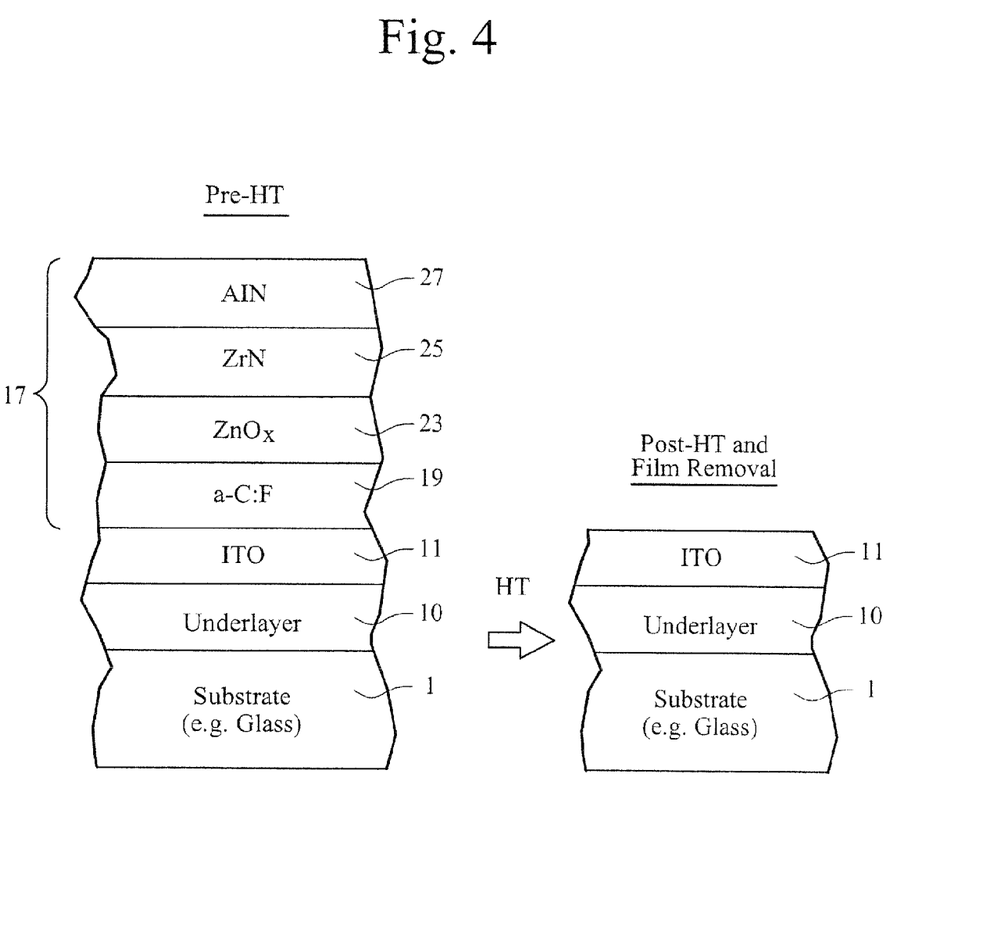
FIG. 4 is a schematic cross sectional view of a coated article, prior to and following heat treatment, according to another example embodiment of this invention.

For example, referring to FIGS. 1-4, certain embodiments of this invention relate to a method of making a coated article including a step of heat treating a substrate (e.g., soda-lime-silica based glass substrate, high temperature glass substrate, sapphire substrate, silicon substrate, or Ge substrate) 1 coated with at least a transparent conductive oxide (TCO) layer 11 of or including a material such as indium tin oxide (ITO) or the like and an overlying protective film 17 thereon. The TCO (e.g., ITO) layer 11 may be from about 1-30 nm thick, more preferably from about 2-10 nm thick, and most preferably from about 3-8 nm thick. The TCO layer 11 (e.g., ITO) may be continuous or patterned in any of the FIG. 1-4 embodiments. In certain example embodiments, from the TCO 11 outwardly, the protective film 17 may be of or include any combination of two, three or four of the following: (i) a gettering and/or doping layer(s) 19; (ii) a stabilizing layer(s) 21; (iii) a release layer(s) 23; and (iv) an oxygen blocking/barrier layer 25. At least layers 23 and 25 are provided in the protective film 17 in certain example preferred embodiments. The protective film 17 allows the TCO 11 on the substrate 1 to withstand HT such as heat treating (e.g., thermally tempering) of a glass substrate 1, with the TCO 11 still achieving sufficient conductivity and transmission following the HT. Optionally, as shown in FIGS. 3-4 for example, an additional metal nitride based layer 27 may be provided, over and/or under the barrier layer 25, in order to further control the release of nitrogen species HT, and to improve durability during storage and transport prior to HT. During HT, the stabilizing layer 21 may diffuse into and become part of release layer 23, so that following HT the release layer 21 includes the material from pre-HT applied stabilizing layer 21. Following and/or during heat treatment (e.g., thermal tempering or the like), the protective film 17 of FIGS. 1-4 may be entirely or partially removed. Following HT, two, three and/or all layers of the protective film 17 may be removed by activating the release layer 23 (possibly including 21) in an aqueous medium of a low pH (e.g., aqueous medium having a pH less than or equal to about 4). For example, layers 21, 23 and 25 of the protective film 17 (with layer 21 having possibly diffused into layer 23 during HT so as to now be part of layer 23) may be removed by activating the release layer 23 (possibly including 21) by applying thereto a liquid such as water, vinegar, and/or orthophosphoric acid(s) which causes the release of release layer 23 thereby allowing and/or causing the protective film 17 to be removed, so that what is left following the removal is the substrate 1 with the TCO layer/electrode 11 (which may be doped with C and/or F from layer 19) thereon. The removal of layers 21, 23, 25 of the protective film using the low pH liquid such as water, vinegar, and/or orthophosphoric acid(s) is so efficient that no brush is needed in the removal process in certain example embodiments. However, brushing (e.g., via rotating brushes such as nylon brushes or the like) may be used to remove film 17 when wetted with water or the like in certain example instances. The TCO (e.g., ITO) of layer 11 is still in good condition, with good conductivity and good visible transmission, following the HT and removal of film 17. A "layer" herein may be continous or discontinuous in different example embodiments; this is particularly applicable to gettering and/or doping layer 19 which may be very thin and thus discontinuous even prior to HT in certain example embodiments of this invention. Other embodiments of this invention relate to the pre-HT coated article, or the post-HT coated article.

In certain example embodiments, an example advantage of using distinct and different oxygen-blocking 25 and release 23 (possibly including 21) layers in the protective film 17 is that each layer of the protective film can be optimized for its intended function. In certain example embodiments, an example advantage of using distinct and different films in the protective film for gettering and/or doping (e.g., layer 19), oxygen-blocking (e.g., layer 25), and releasing (e.g., layer 21 and/or 23) is that each layer of the protective film can be optimized for its intended function. In certain example embodiments, an example advantage of using distinct and at least partially different films in the protective film for gettering and/or doping (e.g., layer 19), stabilizing (e.g., layer 21), oxygen-blocking (e.g., layer 25), and releasing (e.g., layer 23 and/or 21) is that each layer of the protective film can be optimized for its intended function. Consequently, the optimized performance of the protective film 17 may be improved and it can be made thinner if desired.

Still referring to FIGS. 1-4, in certain example embodiments gettering and doping layer 19 may be of or include amorphous carbon doped with a material such as fluorine (a-C:F), and may be deposited on or implanted into the TCO layer 11 by ion beam deposition/implantation where the ion source uses at least $C_2F_6$ gas (and/or other carbon and fluorine inclusive gas(es)) during the deposition and/or implantation. During formation, the ion source (not shown) may use at least $C_2F_6$ gas (and/or other carbon and fluorine inclusive gas(es)) to subimplant the C and F into TCO 11 and then to grow a thin layer of a-C:F on the implanted TCO 11. The subimplanted portion and the overlying grown portion are both considered part of the layer 19 if both occur, whereas if there is only subimplantation into the TCO and no overlying portion then simply the subimplanted material is considered layer 19, and if there is no subimplantation into the TCO and only growing of a layer over the TCO occurs then simply the grown material over the TCO is considered layer 19. The carbon in layer 19 acts as an oxygen getter to mop up oxygen from the surrounding ambient atmosphere attempting to reach the TCO through film 17 during HT, and/or mop up excess oxygen that would tend to diffuse from the grain boundaries into the grains during HT. Meanwhile, the fluorine (F) in layer 19 acts as an extrinsic dopant to the TCO 11 (i.e., F-doping of the ITO via deposition/implantation of layer 19) before and/or after HT in order to improve the conductivity of the TCO 11. The F from layer 19 diffuses into the TCO 11 during HT to improve its conductivity (i.e., reduce the sheet resistance of the TCO following HT). Thus, in certain example embodiments, layer 19 may function to both getter undesirable oxygen and improve the conductivity of the TCO 11 via doping. The F dopes the surface of the TCO 11, the F being an extrinsic dopant of the TCO thereby increasing the concentration of extrinsic dopant(s) in the TCO and improving conductivity; whereas the carbon seems to scavenge excess oxygen and create more oxygen vacancies which act as intrinsic dopants in the TCO 11. While gettering/doping layer 19 may substantially disappear (e.g., diffuse into the TCO and/or possibly release layer 21, 23) during HT, it is believed that F and some C may remain in dopant level concentrations following HT in the body of the TCO layer 11 and/or proximate the surface of the TCO layer 11. Thus, the gettering/doping layer 19 may or may not be considered to be part of protective film 17 in different embodiments of this invention. In certain optional example embodiments of FIGS. 1-4, the F may be omitted from layer 19, and the carbon based layer 19 may act as a gettering layer and the layer 19 may be hydrogenated in certain instances. For example and without limitation, the doping and/or gettering layer 19 of or including carbon (e.g., DLC based) may be any of the DLC inclusive layers of any of U.S. Pat. Nos. 6,592,993; 6,592,992; 6,531,182; 6,461,731; 6,447,891; 6,303,226; 6,303,225; 6,261,693; 6,338,901; 6,312,808; 6,280,834; 6,284,377; 6,335,086; 5,858,477; 5,635,245; 5,888,593; 5,135,808; 5,900,342; or U.S. Pat. No. 5,470,661 (all of these patents hereby being incorporated herein by reference), and may be formed by ion beam deposition and/or subimplantation as in any of the above-listed patents. Hydrogen may also be provided in the layer 19 in certain instances. Layer 19 in certain example embodiments may be from about 5-40 Å (angstroms) thick, more preferably from about 5-25 Å thick, and even more preferably from about 5-20 Å thick as measured from the upper surface of the TCO 11.

Any of the embodiments of FIGS. 1-4 may include stabilizing layer 21, which may be of or including zinc oxynitride. While layer 21 is not shown in FIGS. 3-4, and need not be present in all embodiments, it may be present in any of the FIG. 1-4 embodiments directly under and contacting release layer 21 prior to any HT. The layer 21 of or including zinc oxynitride has been surprisingly found to be beneficial in stabilizing the underlying TCO upper surface and reducing formation of pores in the TCO. The stabilizing layer 21 has been found to help prevent the TCO (e.g., ITO) 11 from decomposing during HT. In certain example embodiments, the zinc oxynitride of the stabilizing layer 21 diffuses into release layer 23 and/or transforms into substantially zinc oxide upon HT. Thus, after HT and before the removal step, the layer stack may be said to be of or including TCO 11/ZnO based release layer 23/barrier layer 25, with the material from stabilizing layer 21 having diffused into and/or transformed into part of the release layer 23 during HT. The zinc oxynitride inclusive stabilizing layer 21 may be deposited by sputtering at room temperature, and may be doped with Al (e.g., from about 1-15% Al, more preferably from about 2-12% Al, and most preferably from about 2-8% (atomic %) Al). In certain example embodiments of this invention, the stabilizing layer 21 may be from about 10-120 Å (angstroms) thick, more preferably from about 10-60 Å thick, and even more preferably from about 10-40 Å thick prior to HT.

Referring to the embodiments of FIGS. 1-4, the layer stack includes release layer 23 which may be of or include zinc oxide in certain example embodiments. This layer 23 (which may optionally also include layer 21 post-HT) acts as a release following HT. In certain example embodiments of this invention, release layer 23 may be of or include ZnO$_y$, where "y" is less than or equal to 1. In certain example embodiments, y may be from about 0 to 0.9, more preferably from about 0.1 to 0.9, even more preferably from about 0.1 to 0.8, and possibly from about 0.1 to 0.7 so that the zinc oxide of layer 23 is substoichiometric at least prior to HT. The release layer 23 of or including ZnO$_y$ may also include nitrogen (e.g., from about 1-20% nitrogen) in certain example embodiments. Advantageously, it has been found that the use of zinc oxide based layer 23 that is substoichiometric permits more efficient and easier removal of the protective film 17 during and/or following heat treatment (HT). The different compositions of layers 23 and 25 is used to cause different stresses in these layers, which stresses are manipulated so as to allow the film 17 to be more easily removed during and/or following HT. In certain example embodiments, release layer 23 is more dissolvable in water and/or vinegar than is barrier layer 25. Moreover, in certain example embodiments, oxygen barrier layer 25 is more of a barrier to oxygen and/or is harder than is release layer 23. In particular, more metallic (substoichiometric) zinc oxide based release layer 23 may be considered a release layer for allowing the film 17 to be easily removed from the TCO or substrate during and/or after HT due to its reduced or little oxygen content, whereas the overlying layer(s) 25 (e.g., of or including aluminum nitride and/or zirconium nitride) may be considered an oxygen blocking/barrier layer that reduces or prevents the TCO from decomposing and/or losing significant conductivity during HT. Zinc oxide is an advantageous material for layer 23 because it can be easily removed (e.g., using water and/or vinegar) during and/or following HT in a non-toxic manner. After heat treatment or HT (e.g., tempering), the product is exposed to a mildly reactive liquid (e.g., water, vinegar, dilute ammonia and/or bleach), and the liquid penetrates through to the release layer 23 via pinholes or grain boundaries in the overlying layer(s) 25 and/or 27 and causes the release layer 23 to disband from the TCO 11. Thus, at least the release layer 23 (possibly including 21) and the oxygen barrier layer 25 and/or 27 are removed following the HT. As noted above, layer 23 may be of or including zinc oxide and may be substoichiometric. This substoichiometric feature of layer 23 is advantageous for oxygen gettering purposes during HT. If the zinc oxide of the entire film 17 is too oxidized (i.e., fully stoichiometric) prior to HT, then oxygen can diffuse through the zinc oxide—but this may be permissible depending upon the make-up and/or presence of optional layer(s) 19 and/or 21. The possible substoichiometric nature of release layer 23 permits the zinc therein to getter oxygen from the surrounding atmosphere during HT, so as to protect the TCO 11 therefrom. Another example advantage of substoichiometric zinc oxide (compared to fully stoichiometric zinc oxide) is that it can be deposited (e.g., via sputtering at room temperature or the like) more quickly. For example, a release layer 23 of substoichiometric zinc oxide may be sputter-deposited using about 10 ml/kW (regarding content of oxygen gas flow), whereas a stoichiometric release layer 23 of zinc oxide may be sputter-deposited using 12 ml/kW (with remainder of the gas being Ar or the like) in example instances. The zinc oxide release layer 23 may be doped with other materials such as Al, N, Zr, Ni, Fe, Cr, Ti, Mg, mixtures thereof, or the like, in certain example embodiments of this invention. The zinc oxide release layer 23 may be deposited by sputtering at room temperature, and may be doped with Al (e.g., from about 1-15% Al, more preferably from about 2-12% Al, and most preferably from about 2-8% (atomic %) Al) in certain example embodiments. In certain example embodiments of this invention, release layer 23 (e.g., of or including stoichiometric or substoichiometric zinc oxide) may be deposited (e.g., via sputtering) so as to be from about 50-20,000 Å thick, more preferably from about 50-3,000 Å thick, even more preferably from about 100-1,000 Å thick, with an example thickness being from about 300-700 Å, with an example thickness being about 500 Å ("about" meaning +/−5%).

Referring to FIGS. 1-4, the layer stack includes oxygen blocking/barrier layer 25 which may be of or include aluminum nitride (e.g., AlN) in certain example embodiments. Barrier layer(s) 25 (e.g., of or including aluminum nitride) may be considered an oxygen blocking/barrier layer that reduces or prevents the TCO 11 from decomposing and/or losing significant conductivity during HT. The barrier layer 25 of or including a material such as aluminum nitride acts as an oxygen diffusion barrier as well as for reducing and/or blocking any ingress of sulphur based species from the ambient atmosphere during HT (e.g., thermal tempering of the underlying glass substrate 1 upon which the coating is located). The barrier layer 25 is more metallic than is release layer 23 in certain example embodiments, so as to improve the barrier nature of the layer 25 relative to the release layer 23. While aluminum nitride is a preferred material for barrier layer 25, this invention is not so limited and the barrier layer 25 may be also and/or instead be of or include material such as ZrN, SiC, SiN, and/or the like. Absent the barrier layer 25, the TCO (e.g., ITO) 11 would sublime and lose significant conductivity if subjected to HT such as thermal tempering of the underlying glass substrate 1. In certain example embodiments of this invention, barrier layer 25 (e.g., of or including aluminum nitride) may be deposited (e.g., via sputtering at room temperature) so as to be from about 50-600 Å thick, more preferably from about 50-400 Å thick, even more preferably from about 100-300 Å thick, with an example thickness being about 200 Å ("about" meaning +/−5%). Barrier layer 25 is thinner than release layer 23 in certain example embodiments, e.g., at least about 100 Å thinner, and more preferably at least about 200 Å thinner.

In any of the FIG. 1-4 embodiments, an optional underlayer 10 may be provided between at least the substrate 1 and the TCO 11. The underlayer 10 may be of or include aluminum oxide (e.g., Al$_2$O$_3$) in certain example embodiments, and may be particularly useful for high temperature stable substrates 1 such as Si or Ge substrates. Alternatively, the optional underlayer 10 may be of or include other materials (e.g., silicon oxynitride and/or silicon nitride) in other embodiments of this invention. When the substrate 1 is a glass substrate, the underlayer 10 may help reduce or prevent oxygen and/or sodium (Na) from migrating from the glass 1 into the TCO 11 during HT.

There exists a range of applications whereby for various reasons the transparent substrates 1 (e.g., glass substrates) have to be heat-strengthened and/or thermally tempered after TCO deposition. This is not a problem for TCOs such as pyrolitically deposited tin oxide. However, this is a problem for other types of TCO such as sputter-deposited ITO as explained below. And there are certain applications where the sputtered TCO only meet the desired high $\sigma_{dc}/\sigma_{opt}$ specifications after HT. Known techniques exist that can allow the heat post processing of ITO films in air but they are limited to about 350 C—not as high as glass tempering temperatures. These use thin permanent barriers such as tin oxide and Si3N4. In those new regimes of usage, TCOs such as sputtered or FCVA (Filtered Cathodic Vacuum Arc) ITO in particular have a drawback: namely after heat treatment at high temperatures (>500 C) in ambient conditions (air), the TCO's resistivity increases and its $\sigma_{dc}/\sigma_{opt}$ degrades sharply in an undesirable manner such that its conductivity degrades. The TCO also has structural changes whereby it is roughened and also has increased propensity to chemical attack. Certain embodiments of this invention present a class of solutions that address the issue of heat processing of sputter or FCVA deposited TCO (e.g., ITO) on glass (and other substrates such as sapphire) to very high temperatures, even beyond the Tg and Ts of soda-lime-silica based glass. We have found a way of producing those films in a manner that they are post-deposition heat temperable reaching temperatures as high as 600 C or more in air at high rate of heating (as high a 10 K/s) and for long duration of times. Certain embodiments of this invention allow the TCO 11 to realize a post-temper $\sigma_{dc}/\sigma_{opt}$ increased by a factor of 2 or greater while the TCO's surface and bulk structural integrity are not significantly compromised. And the subsequent removal of the overlying layers (e.g., 23 and/or 25) after HT allows the surface of the TCO 11 to be exposed and thus put in electrical contact with subsequent layers in various electronic devices. In fact the work function of the TCO surface is very close to that of the post deposited film.

It is believed that ITO films 11 produced by sputtering are metastable. ITO thin films 11 significantly heated in vacuum may not retain phase. In other words, upon HT such as thermal tempering temperatures, if not protected the ITO will become overoxidized and start to decompose such that its sheet resistance rises and its visible transmittance drops in an undesirable manner. We give a brief description of what is observed when ITO thin film is heated to extremely high temperatures in air on silicon substrates as well as up to above 630 C on soda-lime-silica glass. Prior to heating in air, the $In_2O_3$ and ITO films are degenerate by default due to the very high concentration of defects in the film. During heating, thermally activated oxygen diffusion into the ITO film results in partial compensation of the double charged oxygen vacancies. Extrinsic dopants also diffuse outside the film. Both effects act in a manner to reduce the electrical conductivity of the ITO films upon HT. In addition, a network of nanoscale pores is formed on the surface of the ITO film with a high density of grain boundaries upon HT. And an interfacial solid state reaction takes place between the ITO and the underlying substrate. This reaction is also key to degradation of $\sigma_{dc}/\sigma_{opt}$ but may become an issue only above 900 C in the case of silicon substrate and alumino-slicate glass. By carefully controlling the thickness as well as the composition/density of the layers 23, 25 it is possible to reduce the diffusion of oxygen from air into the TCO film 11 during HT. This mitigates the concentration gradient of oxygen vacancies within the film. Barrier layer 25 can also prevent or reduce the outward diffusion of Sn and O ions, the extrinsic dopants.

FIG. 1(a) is a schematic cross sectional view of a coated article, before and after heat treatment (HT), according to an example embodiment of this invention. Typically, the coated article on the left side of FIG. 1(a) exists during a stage of manufacture prior to heat treatment (HT). Prior to HT and removal, the coated article shown in FIG. 1(a) includes substrate 1 (e.g., glass), optional underlayer 10, TCO layer 11 of or including ITO, getter/dopant layer 19 of or a-C:F, and a sacrificial removable protective film including stabilizing layer 21 of or including zinc oxynitride, release layer 23 of or including zinc oxide, and barrier layer 25 of or including aluminum nitride. The underlayer 10 and TCO (e.g., ITO) 11 are depositing on the substrate 1, such as by sputtering. The TCO 11 may be continuously provided across the substrate 1, or may be patterned. An ion source using at least Ar gas may then be used to direct an ion beam, including Ar ions, onto the surface of the TCO (e.g., ITO) 11 in order to peen the surface of the TCO (e.g., using Ar at 500-1,000 eV) to densify the TCO surface. This peening by the ion beam cleans and smoothes the upper surface of the TCO 11, makes the surface amorphous, and removes any excess oxygen so that the overlying layers to be deposited can better protect the TCO with better adhesion thereto. Note that this Ar ion beam peening of the TCO 11 is applicable to each of the FIG. 1-4 embodiments herein. Still referring to FIG. 1(a), the gettering/doping layer 19 of or including amorphous carbon doped with F is then formed via ion beam as explained above, and thereafter stabilizing layer 21 of or including zinc oxynitride, release layer 23 of or including zinc oxide, and barrier layer 25 of or including aluminum nitride are sputter-deposited on the substrate 1 over the ITO layer 11. The coated article on the left side of FIG. 1(a) is then subject to heat treatment (e.g., thermal tempering of the glass substrate 1). At least part of this HT may be conducted, for example, in an atmosphere including oxygen as known in the art at temperature(s) of from 550 to 800 degrees C., more preferably from 580 to 800 degrees C. The HT may last for at least one minute, more preferably from 1-10 minutes, in certain example non-limiting embodiments of this invention. During HT, the presence of protective film 17 protects the TCO 11 from the HT and prevents/reduces significant oxidizing of TCO 11. The protective film 17 protects the TCO during the HT as explained above. As explained above, during HT the stabilizing layer 21 may diffuse into and become part of the release layer 23, and the C and F of the doping/gettering layer be diffuse into the TCO 11. Following HT, the product is exposed to a mildly reactive liquid (e.g., water, vinegar, dilute ammonia and/or bleach), and the liquid penetrates through to the release layer 23 via pinholes or grain boundaries in the overlying layer 25 and causes the release layer 23 to disband from the TCO 11. Thus, at least the release layer 23 (possibly including 21) and the oxygen barrier layer 25 are removed following the HT.

FIG. 1(b) illustrates another example embodiment of this invention. The FIG. 1(b) embodiment is the same as the FIG. 1(a) embodiment discussed above, except that it is emphasized that the materials in the FIG. 1(a) embodiment are not limiting and that other materials may instead or in addition may be used in the FIG. 1(b) embodiment. For example, the TCO 11 may be of a transparent conductive oxide material other than ITO. The layer 19 may be of a different material, such as DLC absent F. The release layer 23 may be of or include zinc oxide or any other suitable material such as magnesium oxide. The barrier layer 25 may be of or include aluminum nitride or any other suitable material such as zirconium nitride or silicon zirconium nitride. The optional additional materials apply to each of FIGS. 1-4.

FIG. 2 illustrates another example embodiment of this invention. The FIG. 2 embodiment is the same as the FIGS. 1(a) and 1(b) embodiments, except that the TCO film further includes layers 4, 6 and 8 in addition to conductive ITO layer 11. Layers 4 and 8 may be dielectric, and may be of or include zinc oxide which may or may not be doped with Al. Layer 6 may be conductive, and may be of or include Ag or Au. The addition of layers 4, 6 and 8, in particular conductive layer 6, may improve the conductivity and/or IR reflectance of the TCO film in the FIG. 2 embodiment. Like TCO layer 11, layers 4, 6 and 8 remain after HT and removal of the protective film 17. As with the other embodiments herein, underlayer 10 is optional and need not be present.

FIG. 3 illustrates another example embodiment of this invention. The FIG. 3 embodiment is the same as the FIGS. 1(a), 1(b) and 2 embodiments, except that an additional barrier layer 27 is provided as an uppermost layer over the barrier layer 25. The additional barrier layer 27 may be of or including zirconium nitride. Additional metal nitride based layer 27

(e.g., zirconium nitride) may be provided over and contacting the barrier layer 25 in order to further control the release of nitrogen species during HT, and to improve durability during storage and transport prior to HT. The additional barrier layer 27 is removed along with the barrier layer 25 as described above.

FIG. 4 illustrates another example embodiment of this invention. The FIG. 4 embodiment is the same as the FIGS. 1(*a*), 1(*b*) and 2 embodiments, except that an additional barrier layer 27 is provided between and contacting the uppermost barrier layer 25 and the release layer 23. The additional barrier layer 27 may be of or including zirconium nitride. Additional metal nitride based layer 27 (e.g., zirconium nitride) may be provided under and contacting the barrier layer 25 in order to further control the release of nitrogen species during HT, and to improve durability during storage and transport prior to HT. The additional barrier layer 27 is removed along with the barrier layer 25 as described above. Additional barrier layer 27 (e.g., of or including zirconium nitride), in each of the FIGS. 3 and 4 embodiments, may be deposited (e.g., via sputtering at room temperature) so as to be from about 50-600 Å thick, more preferably from about 50-400 Å thick, even more preferably from about 100-300 Å thick, with an example thickness being about 200 Å ("about" meaning +/−5%).

According to certain example embodiments of this invention, monolithic coated articles herein lose no more than about 15% of their visible transmission due to HT, more preferably no more than about 10%. Moreover, monolithic coated articles herein preferably have a visible transmission after HT of at least about 50%, more preferably of at least about 60 or 75%. Moreover, in certain example embodiments, TCO 11 loses no more than about 20% of its conductivity due to HT, more preferably no more than about 10%.

Figure 5:
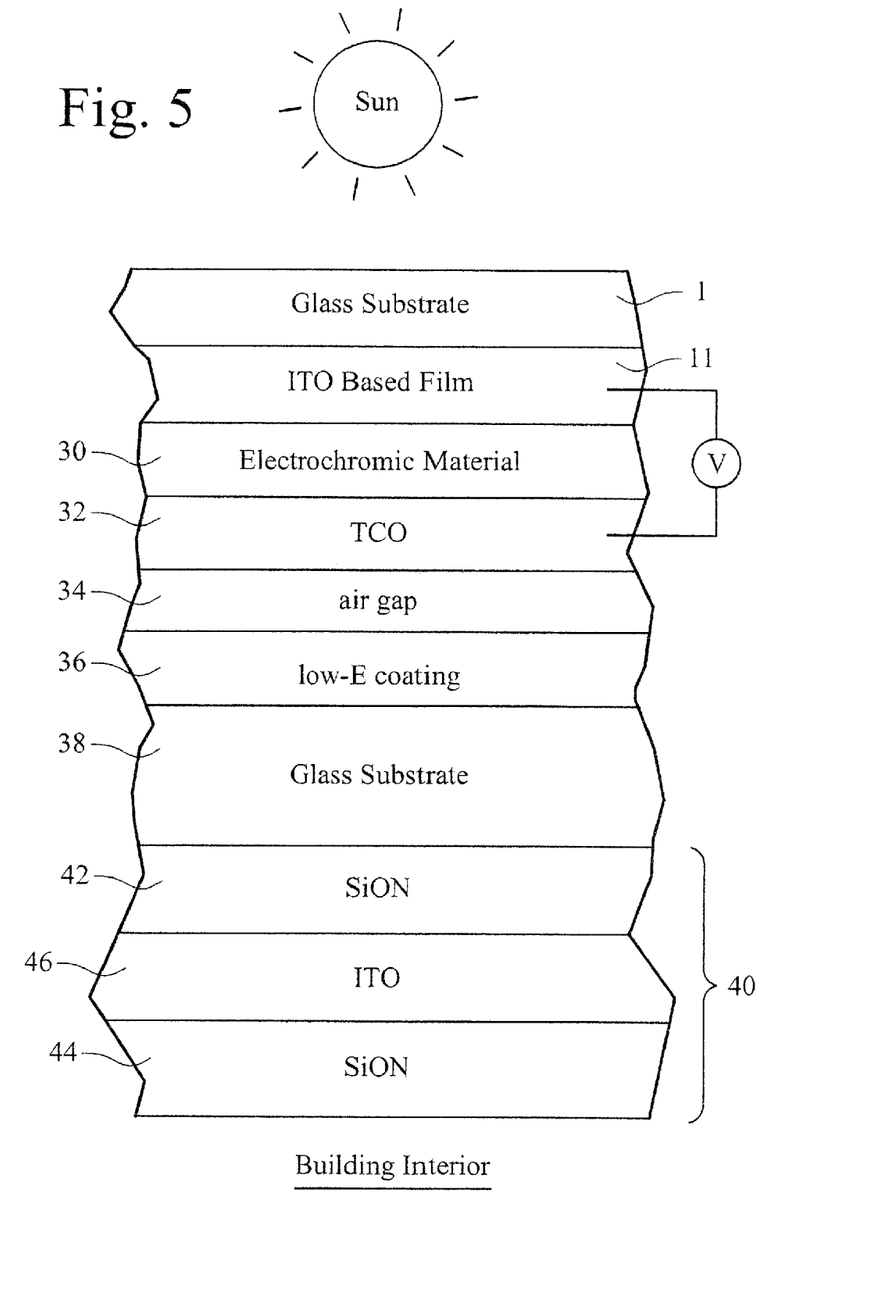
FIG. 5 is a schematic cross sectional view of an electrochomic device including the coated article of any of FIGS. 1-4, according to an example embodiment of this invention.

FIG. 5 is a cross sectional view of an electrochromic (EC) device including the coated article of any of FIGS. 1-4, according to an example embodiment of this invention where the TCO 11 following HT is used as an electrode for the EC material 30. The electrochromic device (e.g., window) of FIG. 5 includes, moving from the external outside atmosphere inwardly toward the interior of the building, heat treated (e.g., thermally tempered) glass substrate 1, TCO (e.g., ITO) layer 11, electrochromic material 30, TCO (e.g., ITO, tin oxide base, or zinc oxide based) 32 which is the other electrode via which voltage is applied across the EC material 30, air gap 34 which may or may not be filled with a gas such as argon, low-E coating 36 which includes at least one IR reflecting layer of or including Ag sandwiched between at least first and second dielectric layers that is used to block IR from entering the building interior, second glass substrate 38, and an ITO-based solar control coating 40 on the surface of substrate 38 facing the building interior. The ITO based solar control coating 40 may, in certain example embodiments, include dielectric silicon nitride and/or silicon oxynitride inclusive layers 42, 44 which sandwich therebetween at least transparent conductive ITO layer 46. In the manufacturing of EC coatings, float glass 1 is first cut to size and tempered and thereafter coated with the EC material. Having a temperable TCO 11 such as ITO with a removable protective and thermal barrier film advantageously allows stock sheets of glass 1 coated with 11 to be shipped to any tempering facility where it can be processed into the right size at a EC coater does not require in-line tempering capability.

In certain example embodiments of this invention, there is provided a method of making a heat treated coated article, the method comprising: heat treating a coated substrate comprising a substrate, a transparent conductive oxide (TCO) layer on the substrate, and a protective film on the substrate over at least the TCO layer, wherein the protective film includes a release layer and an oxygen barrier layer where the release layer and the oxygen barrier layer are of different material and/or different stoichiometry relative to each other, wherein the heat treating comprises heating at least the substrate to temperature(s) of at least 500 degrees C.; during said heat treating of the coated substrate with the TCO layer and the protective film thereon, the protective film protects the TCO layer so that the TCO layer does not lose a significant amount of electrical conductivity and/or a significant amount of visible transmission during said heat treating; and exposing the protective film to a release liquid and removing at least part of the protective film during and/or after said heat treating.

In the method of the preceding paragraph, the substrate can be a glass substrate.

In the method of any of the preceding two paragraphs, the TCO layer can comprise, or consist essentially of indium tin oxide (ITO).

In the method of any of the preceding three paragraphs, the release layer can comprise, or consist essentially of, zinc oxide.

In the method of any of the preceding four paragraphs, the barrier layer can comprise, or consist essentially of, aluminum nitride.

In the method of any of the preceding five paragraphs, the release layer can comprise zinc oxide and the barrier layer can comprise aluminum nitride.

In the method of any of the preceding six paragraphs, the release layer can comprise a suboxide of Zn so that the release layer is substoichiometric at least prior to said heat treating.

In the method of any of the preceding seven paragraphs, at least prior to said heat treating the release layer can comprise $ZnO_y$, where "y" is from about 0.1 to 0.9.

In the method of any of the preceding eight paragraphs, in the protective film prior to said heat treating, the release layer can be more metallic than the barrier layer.

In the method of any of the preceding nine paragraphs, said heat treating can comprise heating at least the substrate to temperature(s) of at least 580 degrees C.

In the method of any of the preceding ten paragraphs, prior to said heat treating, the coated substrate can further comprise a stabilizing layer located between at least the release layer and the TCO layer. The stabilizing layer may comprise zinc oxynitride.

In the method of any of the preceding eleven paragraphs, prior to said heat treating, the coated article can further comprise a gettering and/or doping layer between at least the release layer and the TCO layer. The gettering and/or doping layer may comprise at least one of C and F, preferably both C and F such that it getters oxygen during said heat treating and helps dope the TCO layer with F to improve conductivity.

In the method of any of the preceding twelve paragraphs, the method can include implanting C and/or F ions into the TCO layer prior to said heat treating.

In the method of any of the preceding thirteen paragraphs, the method can comprise implanting F ions into the TCO layer via an ion beam prior to said heat treating.

In the method of any of the preceding fourteen paragraphs, the release liquid can comprise water and/or vinegar.

In the method of any of the preceding fifteen paragraphs, the coated article can be substantially transparent and following the heat treating the TCO layer can be provided as an electrode in an electronic device.

In the method of any of the preceding sixteen paragraphs, after said removing at least part of the TCO layer can be exposed so as to be an outermost layer of the coated article.

In the method of any of the preceding seventeen paragraphs, the barrier layer can comprise, or consist essentially of, zirconium nitride.

In the method of any of the preceding eighteen paragraphs, the protective film can further include a layer comprising zirconium nitride located directly under or directly over the barrier layer.

In the method of any of the preceding nineteen paragraphs, the coated substrate can further comprise an underlayer located between the substrate and the TCO layer.

In the method of any of the preceding twenty paragraphs, the coated substrate can further comprise at least one layer comprising silver located between the TCO layer and the substrate.

In the method of any of the preceding twenty-one paragraphs, the substrate can be a semiconductor substrate.

In certain example embodiments of this invention, there is provided a method of making a heat treated coated article, the method comprising: heat treating a coated glass substrate comprising a glass substrate, a transparent conductive layer comprising ITO on the glass substrate, and a protective film on the glass substrate over at least the layer comprising ITO, wherein the protective film includes a release layer comprising zinc oxide and an oxygen barrier layer comprising metal nitride; during said heat treating of the coated glass substrate with the layer comprising ITO and the protective film thereon, the protective film protects the layer comprising ITO so that the layer comprising ITO does not lose a significant amount of electrical conductivity and/or a significant amount of visible transmission during said heat treating; and removing at least part of the protective film during and/or after said heat treating.

In the method of the preceding paragraph, the heat treating can comprise heating at least the glass substrate to temperature(s) of at least 500 degrees C.

In the method of any of the preceding two paragraphs, the barrier layer can comprise, or consist essentially of, aluminum nitride.

In the method of any of the preceding three paragraphs, the release layer can consist essentially of zinc oxide optionally doped with aluminum.

In the method of any of the preceding four paragraphs, the release layer can comprise a suboxide of Zn so that the release layer is substoichiometric at least prior to said heat treating.

In the method of any of the preceding five paragraphs, at least prior to said heat treating the release layer can comprise $ZnO_y$ where "y" is from about 0.1 to 0.9.

In the method of any of the preceding six paragraphs, in the protective film prior to said heat treating, the release layer can be more metallic than the barrier layer.

In the method of any of the preceding seven paragraphs, said heat treating can comprise heating at least the glass substrate to temperature(s) of at least 580 degrees C.

In the method of any of the preceding eight paragraphs, prior to said heat treating, the coated substrate can further comprise a stabilizing layer located between at least the release layer and the layer comprising ITO. The stabilizing layer may comprise zinc oxynitride.

In the method of any of the preceding nine paragraphs, prior to said heat treating, the coated article can further comprise a gettering and/or doping layer between at least the release layer and the layer comprising ITO. The gettering and/or doping layer may comprise at least one of C and F, preferably both C and F such that it getters oxygen during said heat treating and helps dope the TCO layer with F to improve conductivity.

In the method of any of the preceding ten paragraphs, the method can include implanting C and/or F ions into the layer comprising ITO prior to said heat treating.

In the method of any of the preceding eleven paragraphs, the method can comprise implanting F ions into at least an upper portion of the layer comprising ITO via an ion beam prior to said heat treating.

In the method of any of the preceding twelve paragraphs, a release liquid comprising water and/or vinegar can be used in removing at least part of the protective film.

In the method of any of the preceding thirteen paragraphs, after said removing at least part of the TCO layer can be exposed so as to be an outermost layer of the coated article.

In the method of any of the preceding fourteen paragraphs, the barrier layer can comprise, or consist essentially of, zirconium nitride.

In the method of any of the preceding fifteen paragraphs, the protective film can further include a layer comprising zirconium nitride located directly under or directly over the barrier layer.

In the method of any of the preceding sixteen paragraphs, the coated substrate can further comprise an underlayer located between the glass substrate and the layer comprising ITO.

In the method of any of the preceding seventeen paragraphs, the coated substrate can further comprise at least one layer comprising silver located between the layer comprising ITO and the glass substrate.

In certain example embodiments of this invention, there is provided a heat treated coated article comprising: a thermally tempered glass substrate; a transparent conductive layer comprising ITO on the tempered glass substrate; and wherein at least an upper portion of the layer comprising ITO is doped with carbon and/or fluorine.

In the coated article of the preceding paragraph, at least the upper portion of the layer comprising ITO can contain from about 0.1 to 15% fluorine, more preferably from about 0.1 to 10% fluorine, and most preferably from about 0.5 to 7% fluorine (atomic %).

In the coated article of any of the preceding two paragraphs, at least the upper portion of the layer comprising ITO can contain from about 0.1 to 15% carbon, more preferably from about 0.1 to 10% carbon, and most preferably from about 0.5 to 7% carbon (atomic %).

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

The invention claimed is:

1. A method of making a heat treated coated article adapted to be used in window, the method comprising:

heat treating a coated substrate comprising a substrate, a transparent conductive oxide (TCO) layer on the substrate, a gettering layer on the substrate over and in direct contact with the TCO layer, wherein the gettering layer comprises carbon and fluorine so as to getter oxygen during said heat treating and help dope the TCO layer with F to improve conductivity, and a protective film on the substrate over at least the TCO layer and the gettering layer, wherein the protective film includes a release layer and an oxygen barrier layer where the release layer and the oxygen barrier layer are of different material and/or different stoichiometry relative to each other, wherein the heat treating comprises heating at least the substrate to temperature(s) of at least 500 degrees C.;

during said heat treating of the coated substrate with the TCO layer and the gettering layer and the protective film thereon, the protective film protects the TCO layer so that the TCO layer does not lose a significant amount of electrical conductivity and does not lose a significant amount of visible transmission during said heat treating so that the coated article is to be used in a window, and the gettering layer getters oxygen and provides fluorine for doping the TCO layer to improve conductivity thereof; and exposing the protective film to a release liquid and removing at least part of the protective film during and/or after said heat treating, before the window is formed.

2. The method of claim 1, wherein the substrate is a glass substrate.

3. The method of claim 1, wherein the TCO layer comprises indium tin oxide (ITO).

4. The method of claim 1, wherein the release layer comprises zinc oxide.

5. The method of claim 1, wherein the barrier layer comprises aluminum nitride.

6. The method of claim 1, wherein the release layer comprises zinc oxide and the barrier layer comprises aluminum nitride.

7. The method of claim 1, wherein the release layer comprises a suboxide of Zn so that the release layer is substoichiometric at least prior to said heat treating.

8. The method of claim 7, wherein, prior to said heat treating, the release layer comprises $ZnO_y$ where "y" is from about 0.1 to 0.9.

9. The method of claim 1, wherein, in the protective film prior to said heat treating, the release layer is more metallic than is the barrier layer.

10. The method of claim 1, wherein said heat treating comprises heating the substrate to temperature(s) of at least 580 degrees C.

11. The method of claim 1, wherein, prior to said heat treating, the coated substrate further comprises a stabilizing layer located between at least the release layer and the TCO layer.

12. The method of claim 11, wherein the stabilizing layer comprises zinc oxynitride.

13. The method of claim 1, wherein the release liquid comprises water and/or vinegar.

14. The method of claim 1, wherein the coated article is substantially transparent and following the heat treating the TCO layer is provided as an electrode in an electronic device.

15. The method of claim 1, wherein after said removing step at least part of the TCO layer is exposed so as to be an outermost layer of the coated article.

16. The method of claim 1, wherein the barrier layer comprises zirconium nitride.

17. The method of claim 1, wherein the protective film further includes a layer comprising zirconium nitride located directly under or directly over the barrier layer.

18. The method of claim 1, wherein the coated substrate further comprises an underlayer located between the substrate and the TCO layer.

19. The method of claim 1, wherein the coated substrate further comprises a layer comprising silver located between the TCO layer and the substrate.

20. A method of making a heat treated coated article adapted to be used in window, the method comprising:

heat treating a coated glass substrate comprising a glass substrate, a transparent conductive layer comprising ITO on the glass substrate, a gettering layer on the glass substrate over and in direct contact with the layer comprising ITO, wherein the gettering layer comprises carbon and fluorine so as to getter oxygen during said heat treating and help dope the TCO layer with F to improve conductivity, and a protective film on the glass substrate over at least the layer comprising ITO and the gettering layer, wherein the protective film includes a release layer comprising zinc oxide and an oxygen barrier layer comprising metal nitride;

during said heat treating of the coated glass substrate with the layer comprising ITO, the gettering layer and the protective film thereon, the protective film protects the layer comprising ITO so that the layer comprising ITO does not lose a significant amount of electrical conductivity and does not lose a significant amount of visible transmission during said heat treating so that the coated article is to be used in a window, and the gettering layer getters oxygen and provides fluorine for doping the layer comprising ITO to improve conductivity thereof; and removing at least part of the protective film during and/or after said heat treating, before the window is formed.

21. The method of claim 1, wherein the gettering layer comprises amorphous carbon and said fluorine.

22. The method of claim 1, wherein the gettering layer is formed via an ion beam.

23. The method of claim 1, wherein the gettering layer is from about 5-40 angstroms thick.

24. The method of claim 20, wherein the gettering layer is from about 5-40 angstroms thick.

25. The method of claim 20, wherein the gettering layer comprises amorphous carbon and said fluorine.

26. The method of claim 1, wherein after the TCO layer has been deposited but before the gettering layer has been deposited, directing an ion beam including at least Ar ions onto the surface of the TCO layer 11 in order to peen the surface of the TCO layer so as to densify the surface of the TCO layer, wherein this peening by the ion beam cleans and smoothes the upper surface of the TCO layer.

* * * * *